United States Patent
Chen et al.

(10) Patent No.: US 11,581,298 B2
(45) Date of Patent: Feb. 14, 2023

(54) ZERO MASK HIGH DENSITY CAPACITOR

(71) Applicant: Taiwan Semiconductor Manufacturing Company Limited, Hsinchu (TW)

(72) Inventors: Chung-Hui Chen, Hsinchu (TW); Wan-Te Chen, Taipei (TW); Cheng-Hsiang Hsieh, Taipei (TW); Chia-Tien Wu, Taichung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/744,398

(22) Filed: Jan. 16, 2020

(65) Prior Publication Data

US 2020/0373290 A1 Nov. 26, 2020

Related U.S. Application Data

(60) Provisional application No. 62/852,406, filed on May 24, 2019.

(51) Int. Cl.
*H01L 27/01* (2006.01)
*H01L 23/522* (2006.01)
(Continued)

(52) U.S. Cl.
CPC ............ *H01L 27/01* (2013.01); *H01L 23/528* (2013.01); *H01L 23/5223* (2013.01);
(Continued)

(58) Field of Classification Search
CPC ............... H01L 23/528; H01L 23/5228; H01L 23/5223; H01L 23/522–53295; H01L 23/5222–5225; H01L 28/20; H01L 28/40; H01L 28/60; H01L 21/768; H01L 21/3205–32155; H01L 21/823475; H01L 21/76801–76837;
(Continued)

(56) References Cited

U.S. PATENT DOCUMENTS 3,985,919 A * 10/1976 Pinch .................... C04B 41/009
427/101
2002/0074581 A1 6/2002 Black et al.
(Continued)

FOREIGN PATENT DOCUMENTS

| JP | 2014534609 | 12/2014 |
| KR | 20070054225 | 5/2007 |
| KR | 20190054962 | 5/2019 |

OTHER PUBLICATIONS

Korean office action; Application No. 10-2020-0027875; dated Mar. 8, 2021.
(Continued)

*Primary Examiner* — Victor A Mandala
*Assistant Examiner* — Lawrence C Tynes, Jr.
(74) *Attorney, Agent, or Firm* — Jones Day

(57) ABSTRACT

Methods and semiconductor devices are described herein which eliminate the use of additional masks. A first interconnect layer is formed. A first resistive layer is formed on top of the first interconnect layer. A dielectric layer is formed on top of the first resistive layer. A second resistive layer is formed on top of the dielectric layer.

20 Claims, 18 Drawing Sheets

(51) Int. Cl.
*H01L 23/528* (2006.01)
*H01L 49/02* (2006.01)

(52) U.S. Cl.
CPC .......... *H01L 23/5228* (2013.01); *H01L 28/20* (2013.01); *H01L 28/40* (2013.01)

(58) Field of Classification Search
CPC ........ H01L 21/76807–76813; H01L 21/31144; H01L 21/32139; H01L 21/76897; H01L 2221/10–1094; H01L 2221/1015–1036; H01L 27/01
See application file for complete search history.

(56) References Cited

U.S. PATENT DOCUMENTS

| | | | |
|---|---|---|---|
| 2004/0253783 A1* | 12/2004 | Egashira | H01L 23/5228 257/E21.59 |
| 2005/0082639 A1 | 4/2005 | Kikuta et al. | |
| 2005/0121744 A1* | 6/2005 | Chang | H01L 23/5223 257/532 |
| 2007/0296085 A1 | 12/2007 | Coolbaugh et al. | |
| 2013/0271938 A1* | 10/2013 | Lindert | H01L 27/10814 361/782 |
| 2017/0141026 A1* | 5/2017 | Tu | H01L 27/2436 |
| 2018/0226453 A1* | 8/2018 | Yl | H01L 27/265 |

OTHER PUBLICATIONS

Taiwan office action; Application No. 109113835; dated Dec. 21, 2020.
German office action; Application No. 10 2020 101 395.7; dated Jun. 20, 2021.
Korean office action; Application No. 10-2020-0027875; dated Sep. 7, 2021.
Korean office action; Application No. 0-2020-0027875; dated Mar. 28, 2022.
Taiwanese Office Action, Application No. 109113835, dated Sep. 21, 2022.

* cited by examiner

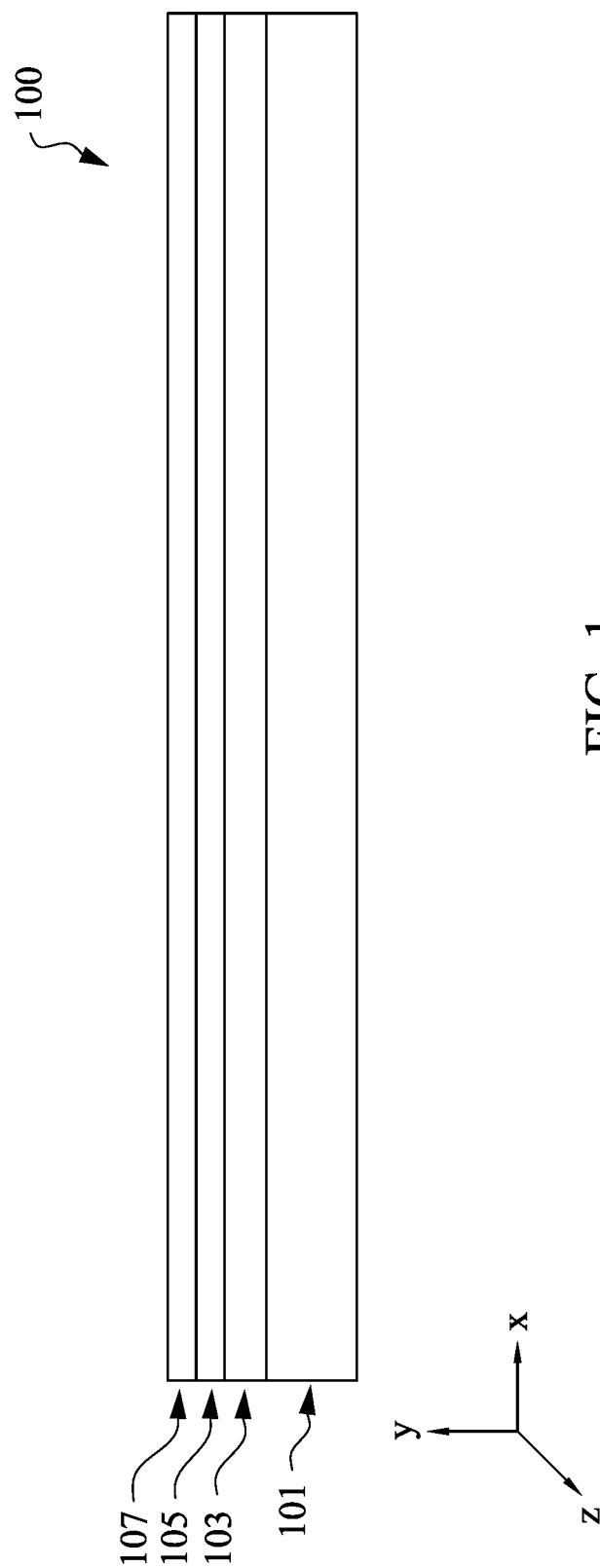

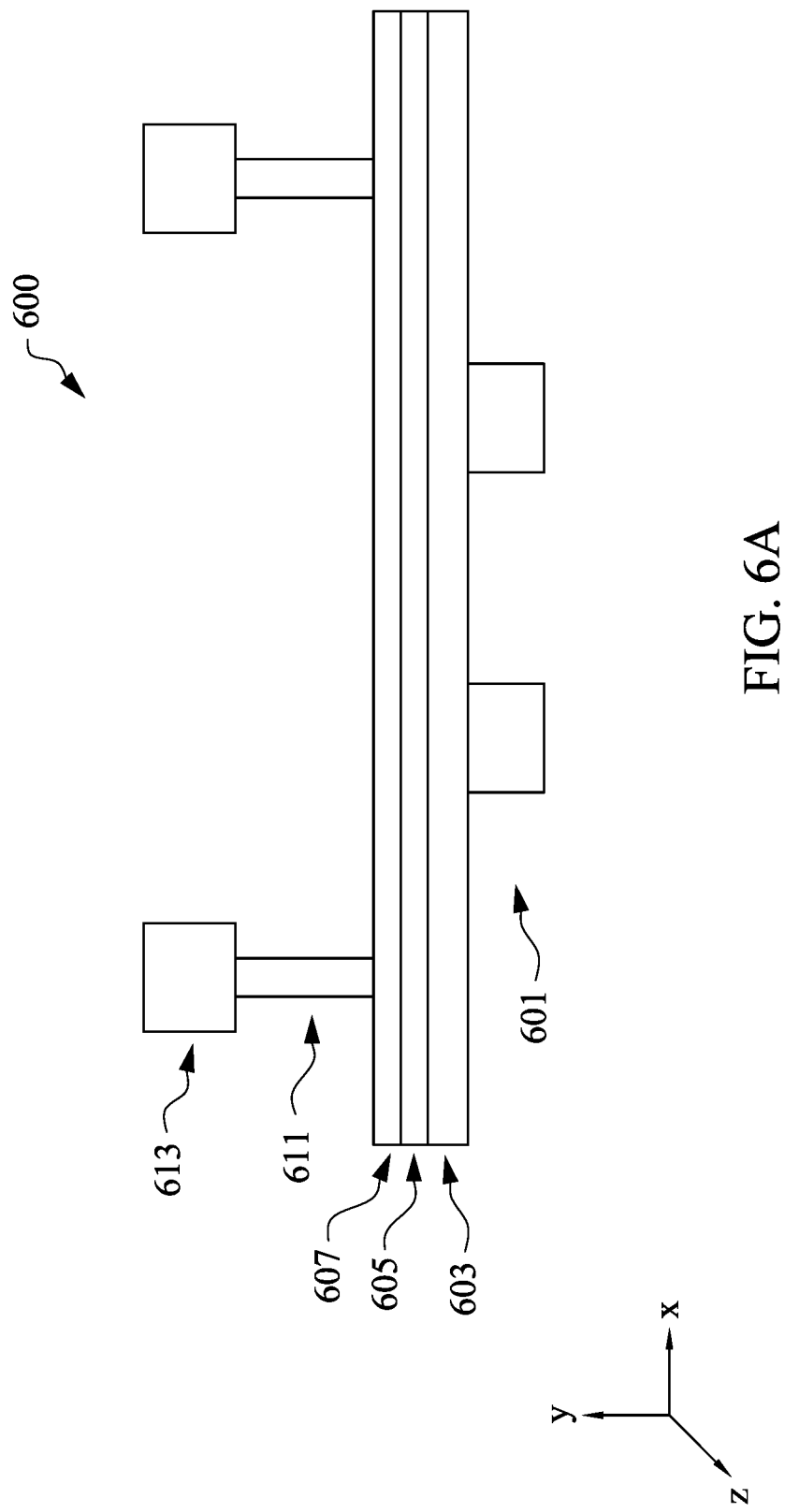

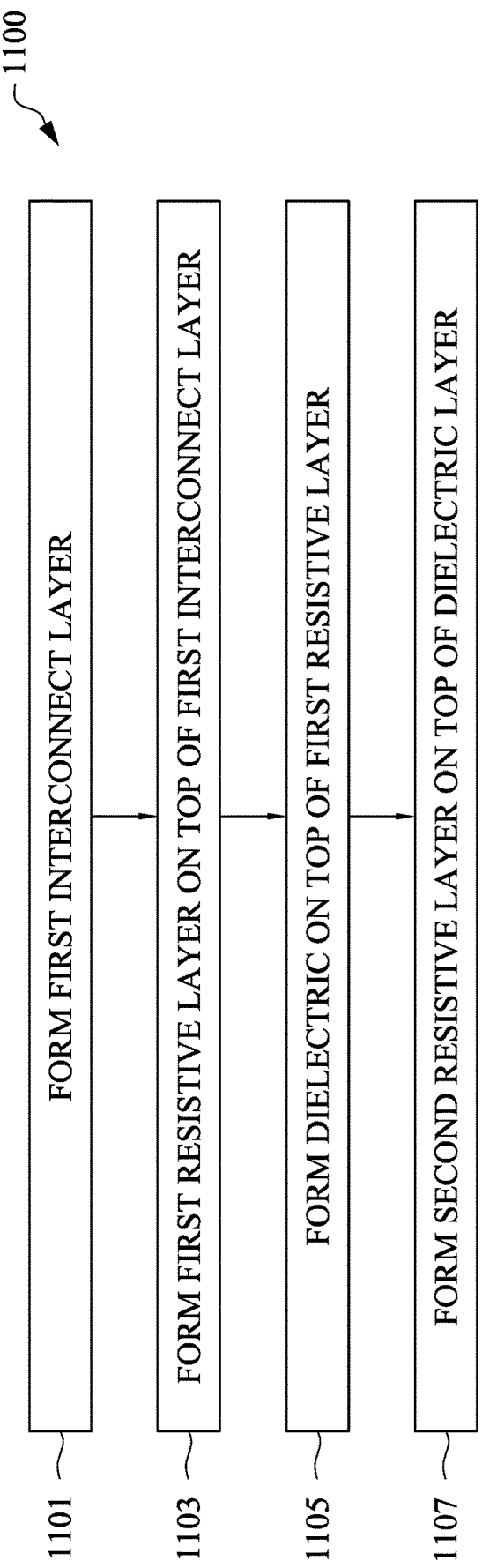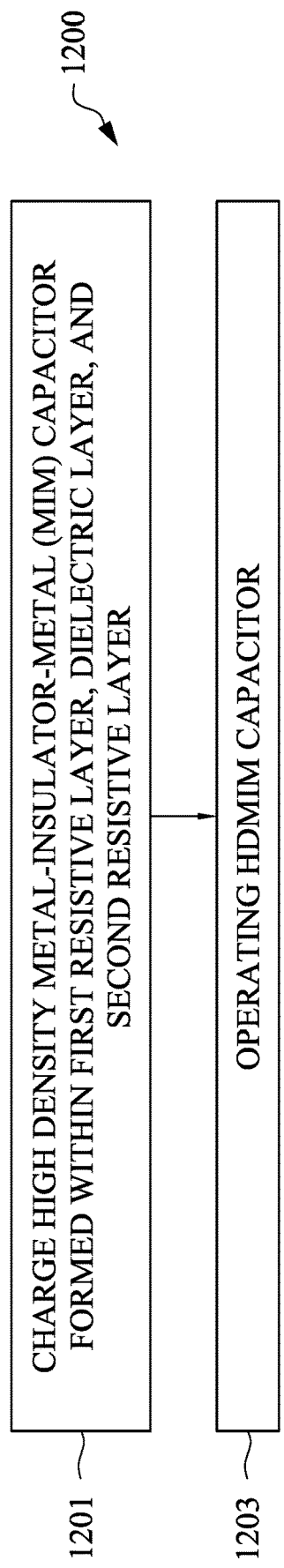
FIG. 11
FIG. 12

ZERO MASK HIGH DENSITY CAPACITOR

PRIORITY CLAIM

The present application claims priority to U.S. Application No. 62/852,406, filed May 24, 2019, the content of which is incorporated by reference herein in its entirety.

FIELD

The technology described in this disclosure relates generally to electronic devices and more particularly to semiconductor devices.

BACKGROUND

With the exponential growth in the semiconductor integrated circuit (IC) industry, technological advances in IC materials and design have produced generations of ICs where each generation has smaller and more complex circuits than the previous generation. In the course of IC evolution, functional density has generally increased while geometry size has decreased. This scaling down process generally provides benefits by increasing production efficiency and lowering associated costs. The layout of resistors and capacitors have been taken into consideration for an efficient area cost in advanced semiconductor process.

A semiconductor die in a layout may include an analog area, a digital area, and a memory area. Resistors are added in the die in order to reduce noise and control the speed of etching in large areas. Metal-insulator-metal (MIM) capacitors are formed using thin oxide and metal plates. A parasitic capacitance can exist between the bottom metal plate and a bottom substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 depicts a cross-sectional view of an exemplary semiconductor device, in accordance with various embodiments of the present disclosure.

FIG. 6A depicts a cross-sectional view of an example semiconductor device in accordance with various embodiments of the present disclosure.

FIG. 11 depicts an example flow chart depicting a process for manufacturing a semiconductor device in accordance with various embodiments of the present disclosure.

FIG. 12 depicts an example flow chart depicting a process for operating a semiconductor device in accordance with various embodiments of the present disclosure.

DETAILED DESCRIPTION

Figure 2A:
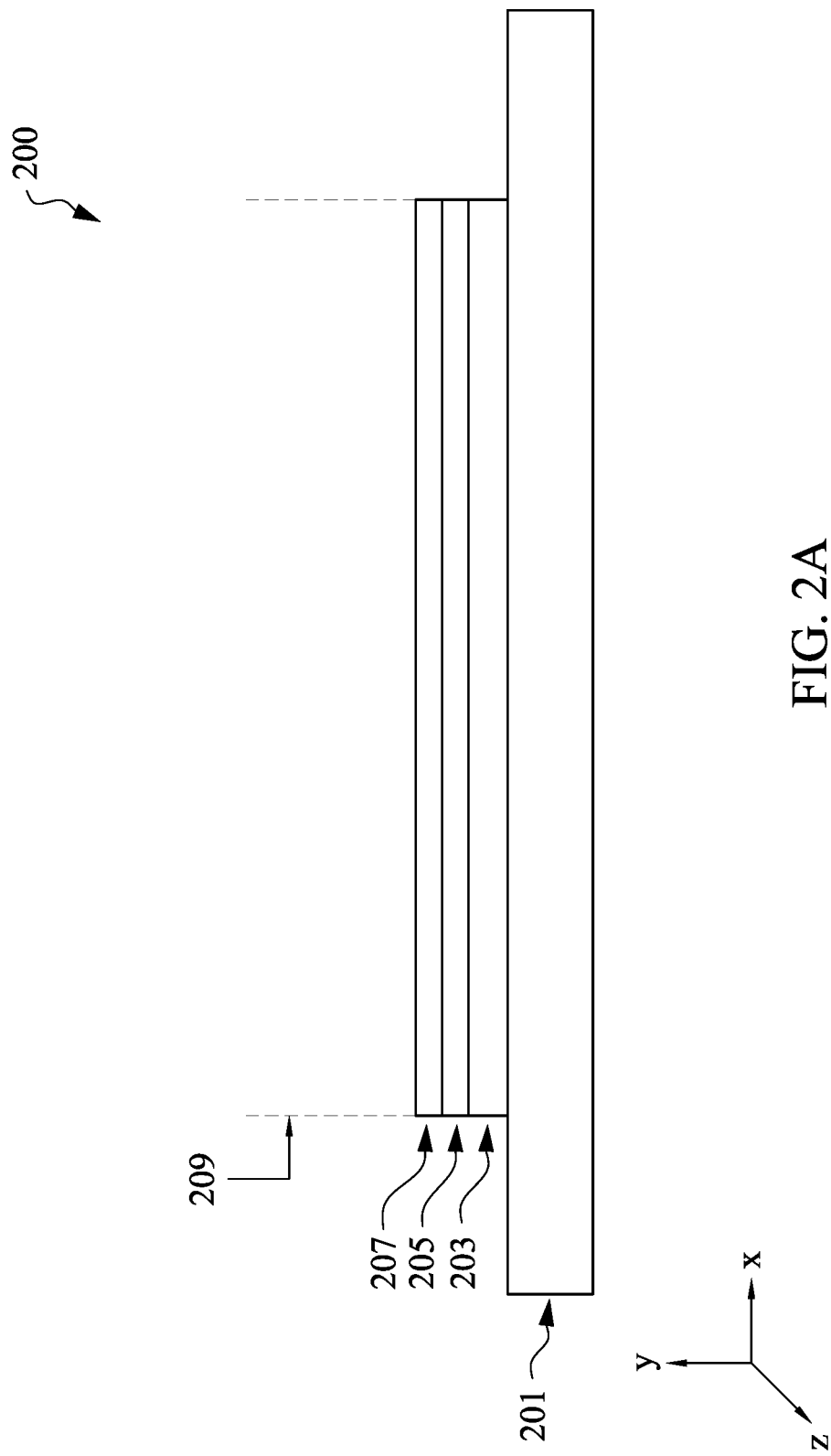
FIG. 2A depicts a cross-sectional view of a patterned semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

ICs are developed with one or more overlapping layers. Manufacturers develop specific geometries for these ICs to perform particular functionalities, such as functioning as an amplifier, oscillator, timer, microprocessor or memory. Manufacturing methods typically involve fabricating semiconductor ICs using photolithography, deposition, and etching. Designers optimize ICs with different goals in mind such as cost, functionality, size, and/or surface area. One expenditure in manufacturing semiconductor ICs is the number of different photomasks or masks necessary for the semiconductor devices to be patterned or etched. In back-end-of-line (BEOL) fabrication, individual electrical devices such as transistors, capacitors, and/or resistors are interconnected with a interconnect layer. A number of different masks are used to remove portions of resistive layers which form the electrical devices in order to make space for metal interconnects (e.g., vias). The masks screen some material to remain while allowing other material to be removed by patterning the layers deposited. Semiconductor devices typically contain front-end, middle, and BEOL layers. Semiconductor layouts which form passive devices in the BEOL layers are small scale and can fit additional components into formed integrated circuits. Each mask layer adds additional time and cost to the semiconductor manufacturing process so formations with less mask layers are low cost. Minimizing the number of mask layers required to fabricate the BEOL layers increases efficiency in the fabrication process.

ICs can utilize formed passive devices (e.g., resistors and/or capacitors) which can be electrically coupled to active devices for low cost operation. In some implementations, semiconductor devices form high density MIM (HDMIM) capacitors between metal interconnects for thinner exterior capacitor and advanced scaling. Placing the capacitor in the BEOL preserves space for front end scaling. The HDMIM capacitors can operate as charge pools and provide electrical separation between interconnect layers and electrical components of the semiconductor device. The method of forming HDMIM capacitors in the BEOL layers allows for scaling down of semiconductor devices while maintaining capacitor structures. The photolithography process patterns resistive and capacitive layers to allow room for vias between interconnect layers. During formation of the HDMIM capacitors, the use of an extra mask layer can be eliminated by forming a structure having a dielectric layer between two resistive layers on top of an interconnect layer. A single mask layer can be used to define the shapes of the resistive layers, the dielectric layer, and the interconnect layer.

FIG. 1 depicts a cross-sectional view of an exemplary semiconductor device 100, in accordance with various embodiments of the present disclosure. The semiconductor device 100 can be formed within or as an element of an IC. Semiconductor device 100 includes a metal interconnect layer 101, two resistive layers 103, 107, and a dielectric layer 105. Resistive layer 103 is deposited onto metal interconnect layer 101. Resistive layer 103 electrically connects to metal interconnect layer 101. Resistive layer 103 also electrically connects metal interconnect layer 101 to dielectric layer 105. Dielectric layer 105 is deposited on top of resistive layer 103 to electrically connect the resistive layer 103 to resistive layer 107. Dielectric layer 105 forms a capacitor between resistive layer 103 and resistive layer 107. In accordance with some embodiments, the type of capacitor formed by dielectric layer 105 can be a MIM capacitor or a HDMIM capacitor. The formed capacitors are used to develop a voltage potential for stabilizing supply voltage to active devices of semiconductor device 100 or to filter frequencies in analog systems. In digital systems, the formed capacitors can be used as a battery or voltage pool. Resistive layer 107 is deposited directly onto the dielectric layer 105. Resistive layer 107 electrically connects dielectric layer 105 to other electrical components. Resistive layer 103 and resistive layer 107 operate as resistors for controlling a voltage differential between coupled electrical components of semiconductor device 100. Semiconductor device 100 allows resistive layers 103, 107 and dielectric layer 105 to be deposited simultaneously onto metal interconnect layer 101. After simultaneous deposition of resistive layers 103, 107 and dielectric layer 105, such layers can be simultaneously patterned using any appropriate patterning technique such as photolithography, with no need for an additional mask.

In some embodiments, resistive layer 103 and/or resistive layer 107 can be made up of one or more of the following materials: W, TiN, TaN, Co, Ru, Ta, TiW, Ta—Si—N, TiZrN, $CoTi_x$, Mo, AlC, $TiGe_n$, Cr, CrAsC, TiAlC, $WN_x$, and/or any material with a resistivity higher than approximately five ohms per centimeter. In other embodiments, resistive layers 103, 107 are made up of a high resistance material to form a thin resistive layer. In alternative embodiments, the material of the resistive layers 103, 107 is selected for prevention of direct electrical connection between resistive layer 103 and resistive layer 107. Resistive layer 103, in accordance with some embodiments, can include thin film resistors.

In some embodiments, resistive layer 103 is characterized by higher resistance than the resistive layer 107. Higher resistance in resistive layer 103 may form resistive characteristics when electrically coupling, in parallel, with metal interconnect layer 101. For example, resistive layer 103 may be made up of a material with resistivity greater than approximately 600 ohms per centimeter squared.

In alternative embodiments, resistive layer 103 may be made up of a lower resistive metal than resistive layer 107 to electrically connect with metal interconnect layer 101 for low voltage differential between metal interconnect layer 101 and resistive layer 103. For example, resistive layer 103 may be made up of a material having a resistivity between 100 to 300 ohms per centimeter squared, while resistive layer 107 may be made up of a material having a resistivity of greater than 600 ohms per centimeter squared.

The dielectric layer 105 may be made of any material with dielectric constant greater than or equal to 1. In some embodiments, the dielectric layer 105 may be made of one or more of $CeO_2$, $La_{20}O_3$, $Y_2O_3$, $ZrO_2$, $TiO_2$, $Al_2O_3$, a-$LaAlO_3$, $HfO_2$, $HfSiO_4$, $La_2O_3$, $Nb_2O_5$, $Si_3N_4$, $SiO_2$, $SrTiO_3$, $Ta_2O_5$, $TiO_2$, $Y_2O_3$, and/or $ZrO_2$. Material having a high dielectric constant provides a number of benefits to the semiconductor device. For example, dielectric material layer 105 can facilitate greater voltage stabilization by preventing short circuits between the resistive layers 103, 107. With some semiconductor layouts, the dielectric layer 105 can allow for a reduction in parasitic capacitance between metal interconnect layers.

Semiconductor device 100 also includes resistive layer 107. In some embodiments, resistive layer 107 is used for the formation of a MIM capacitor. Resistive layer 107 can be made of a material having a resistance greater than or equal to a resistance of resistive layer 103. The varying resistance between resistive layer 103 and 107 can increase the voltage differential between electrically coupled layers. Resistive layer 107, in some embodiments, is made of the same material as resistive layer 103. Resistive layer 107, in other embodiments, can be a metal having a resistivity higher than approximately five ohms per centimeter such as W, TiN, TaN, Co, Ru, Ta, TiW, Ta—Si—N, TiZrN, CoTi$_x$, Mo, AlC, TiGe$_n$, Cr, CrAsC, TiAlC, and/or WN$_x$.

Figure 2B:
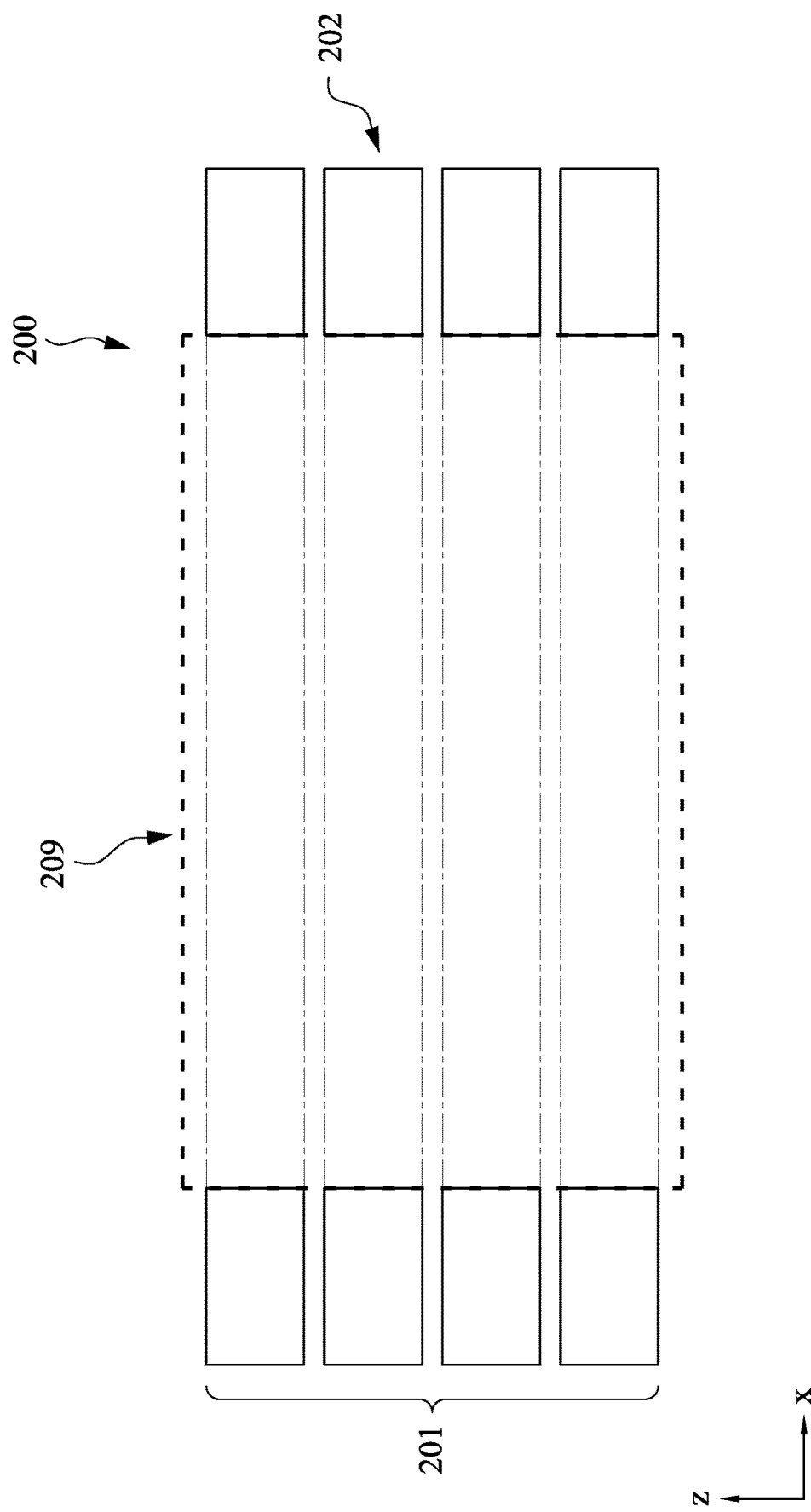
FIG. 2B depicts a top-down view of semiconductor device of FIG. 2A in accordance with various embodiments of the present disclosure.

FIG. 2A depicts a cross-sectional view of a patterned semiconductor device 200 in accordance with various embodiments of the present disclosure. A mask layer 209 simultaneously defines resistive layer 203, the dielectric layer 205, and resistive layer 207. Mask layer 209 forms space for vias by patterning the layers below so that material may be removed. For example, FIG. 2B depicts a top-down view of semiconductor device 200 of FIG. 2A. As illustrated in FIG. 2B, the first interconnect layer 201 is not fully overlapped by the resistive layer 203, the dielectric layer 205, and resistive layer 207. The space in which the first interconnect layer 201 has no overlapped allows for electrical connection to other layers or devices. Semiconductor device 200 design operates with functionality for some connections to avoid the electrical characteristics of the resistive and dielectric layers while others connect through for passive devices.

Figure 2C:
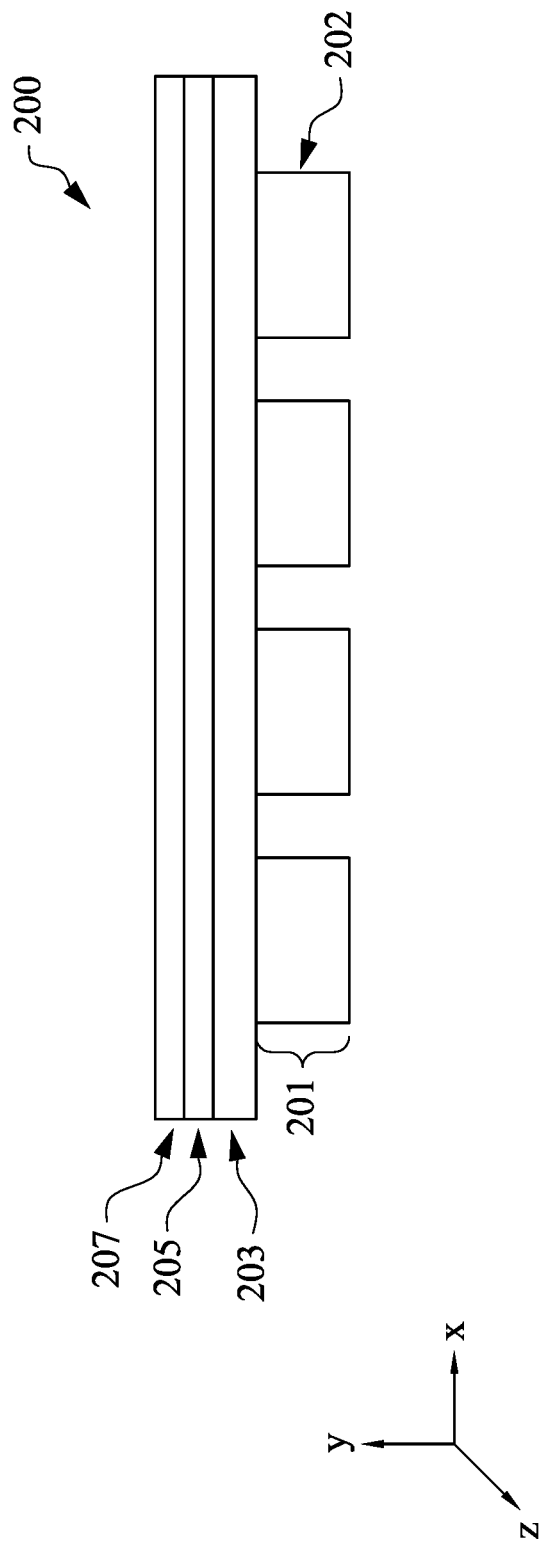
FIG. 2C depicts a side profile view of semiconductor device of FIG. 2A in accordance with various embodiments of the present disclosure.

FIG. 2C depicts a side profile view of semiconductor device 200 of FIG. 2A in accordance with various embodiments of the present disclosure. Metal interconnect deposits 202 are formed to avoid direct electrical connection. In some embodiments, the metal interconnect deposits 202 are electrically connected through resistive layer 203 to form a voltage differential.

In some embodiments, resistive layer 203 has a higher resistance than resistive layer 207 for reduced current through resistive layer 203 and greater voltage differential. In other embodiments, resistive layer 203 has lower resistance than the second resistive layer 207 for low voltage differential to allow for greater voltage differential between electrical connections connected to resistive layer 207 and a lower voltage differential between metal interconnect deposits 202 in metal interconnect layer 201.

Figure 3A:
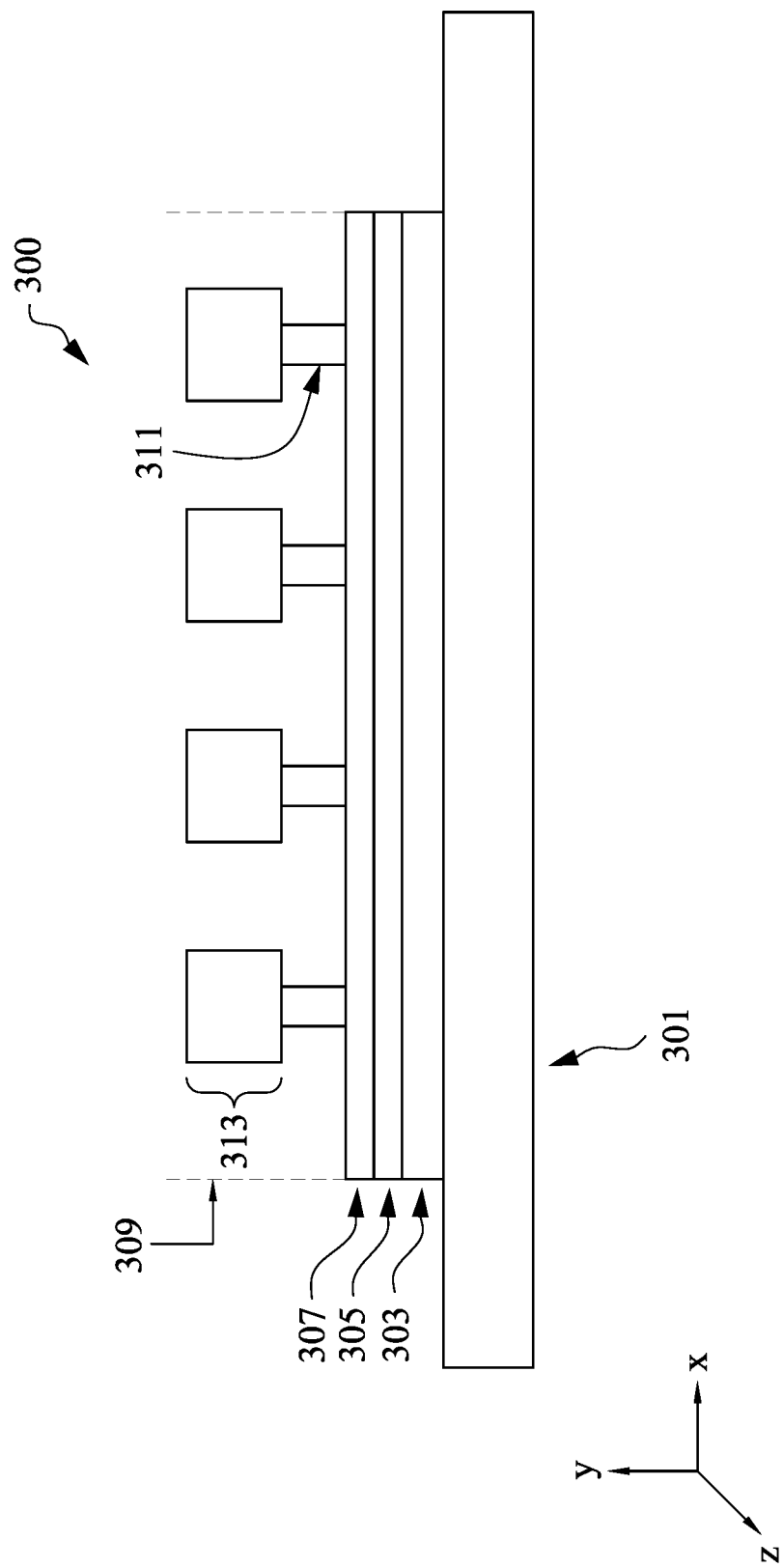
FIG. 3A depicts a cross-sectional view of an example semiconductor device having vias in accordance with various embodiments of the present disclosure.

FIG. 3A depicts a cross-sectional view of an example semiconductor device 300 having vias 311 in accordance with various embodiments of the present disclosure. Vias 311 connect additional metal interconnect layers 313. An electrical connection between metal interconnect layer 313 and the metal interconnect layer 301 is formed so that current passes through resistive layer 303, the dielectric layer 305, and resistive layer 307. Semiconductor device 300 forms a MIM capacitor between the first interconnect layer 301 and the second interconnect layer 313. The MIM capacitor forms due to the formation of parasitic capacitance across resistive layer 303 and resistive layer 307 through the dielectric layer 305. In some embodiments, either resistive layer 303 or resistive layer 307 is characterized by high resistance to effectively store more electric charge. In some embodiments, the dielectric layer 305 is characterized by high capacitance to store electric charge and stabilize supply voltage of connecting devices. Resistive layer 303 and resistive layer 307 may be thin to allow for low voltage differential between connected metal interconnect layer 301 and metal interconnect layer 313 through resistive layer 303, the dielectric layer 305, and resistive layer 307.

Figure 3B:
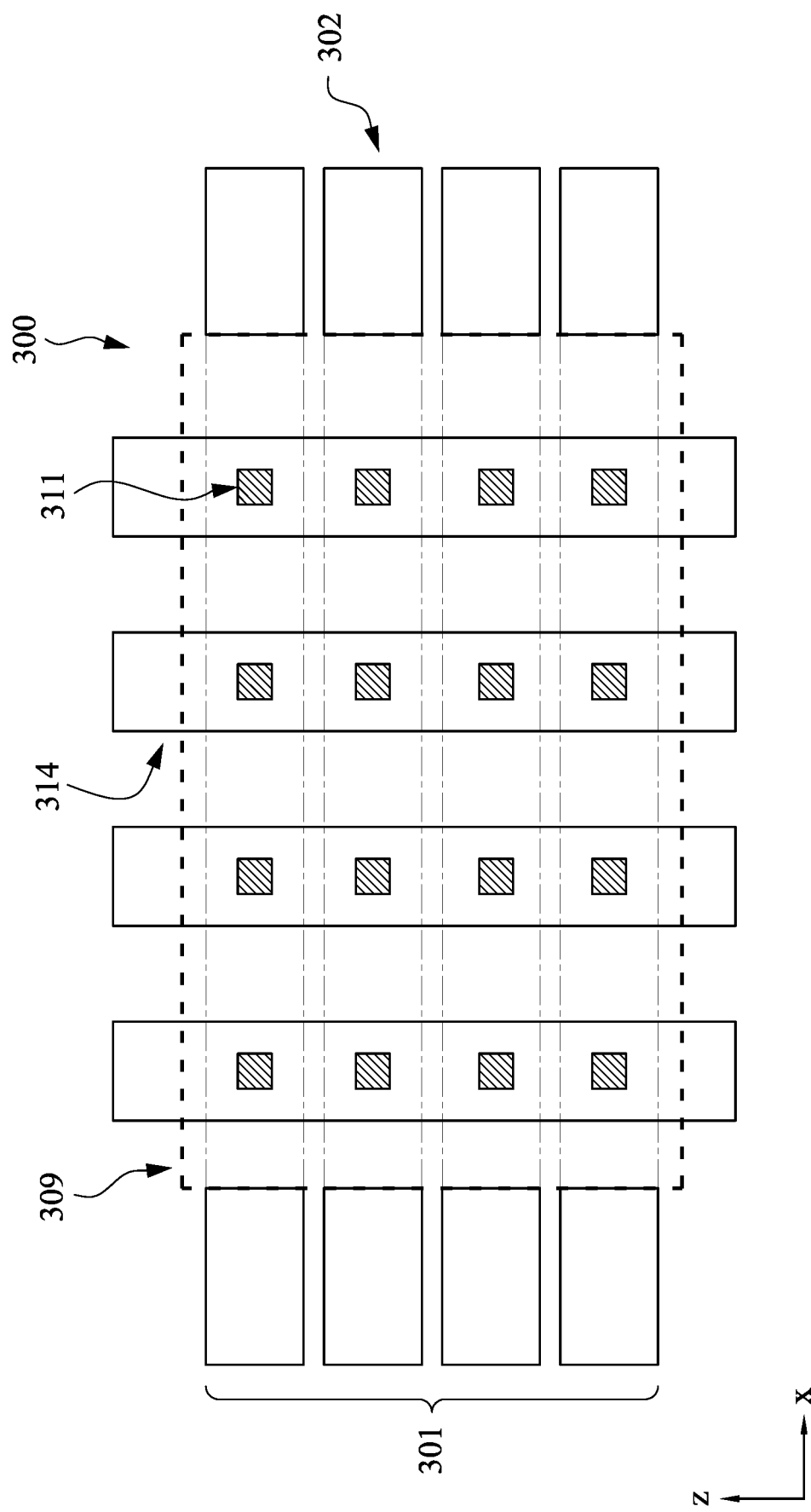
FIG. 3B depicts a top-down cross sectional view of the semiconductor device of FIG. 3A in accordance with various embodiments of the present disclosure.

FIG. 3B depicts a top-down cross sectional view of the semiconductor device 300 of FIG. 3A in accordance with various embodiments of the present disclosure. The first interconnect layer deposits 302 may form tangential to the second interconnect layer deposits 313. The mask layer 309 allows for partial removal of resistive layer 303, the dielectric layer 305, and resistive layer 307 through photolithography. Semiconductor device 300 operates for BEOL connections in which the non-overlapped deposits 302 of the first interconnect layer may be connected to above devices directly through a via. Vias 311 are formed on resistive layer 307 for improved accuracy. Vias 311 are smooth for consistent electrical connection between resistive layer 307 and metal interconnect layer 313.

Figure 3C:
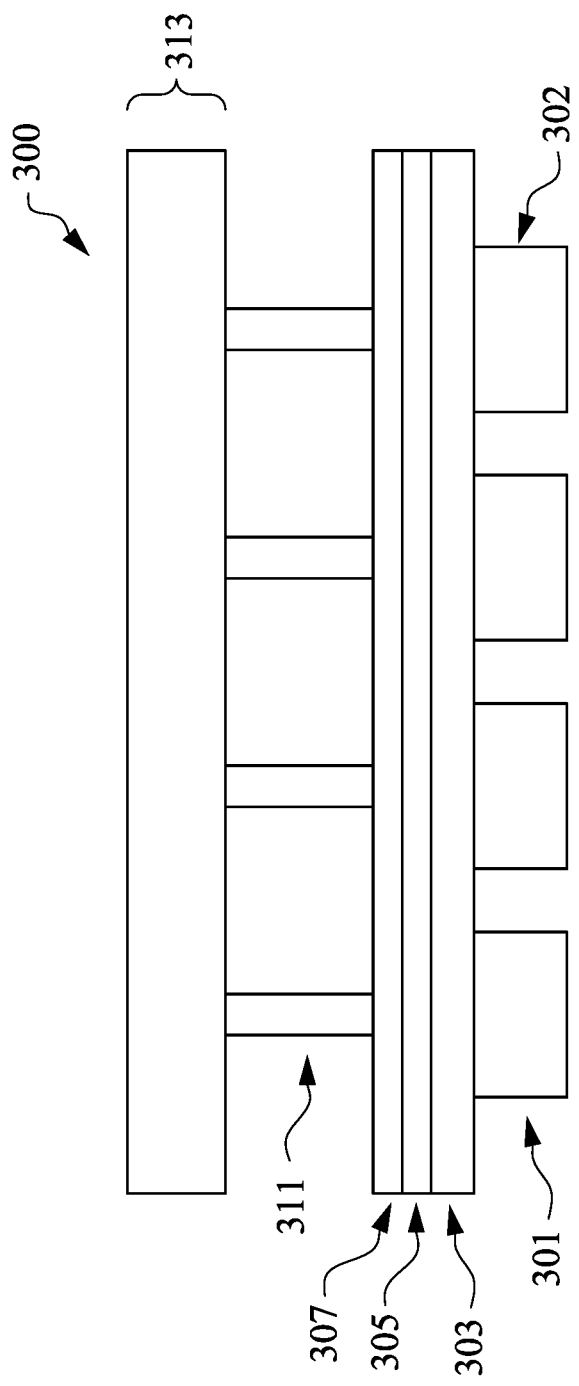
FIG. 3C depicts a side profile view of the semiconductor device of FIG. 3A in accordance with various embodiments of the present disclosure.

FIG. 3C depicts a side profile view of the semiconductor device 300 of FIG. 3A in accordance with various embodiments of the present disclosure. In some embodiments, vias 311 connect a single metal interconnect deposit 314 to resistive layer 307. In some embodiments, resistive layer 307 is made of a material having a higher resistance than resistive layer 303. With a higher resistance, a voltage differential is formed between different deposits in metal interconnect layer 313.

Figure 4A:
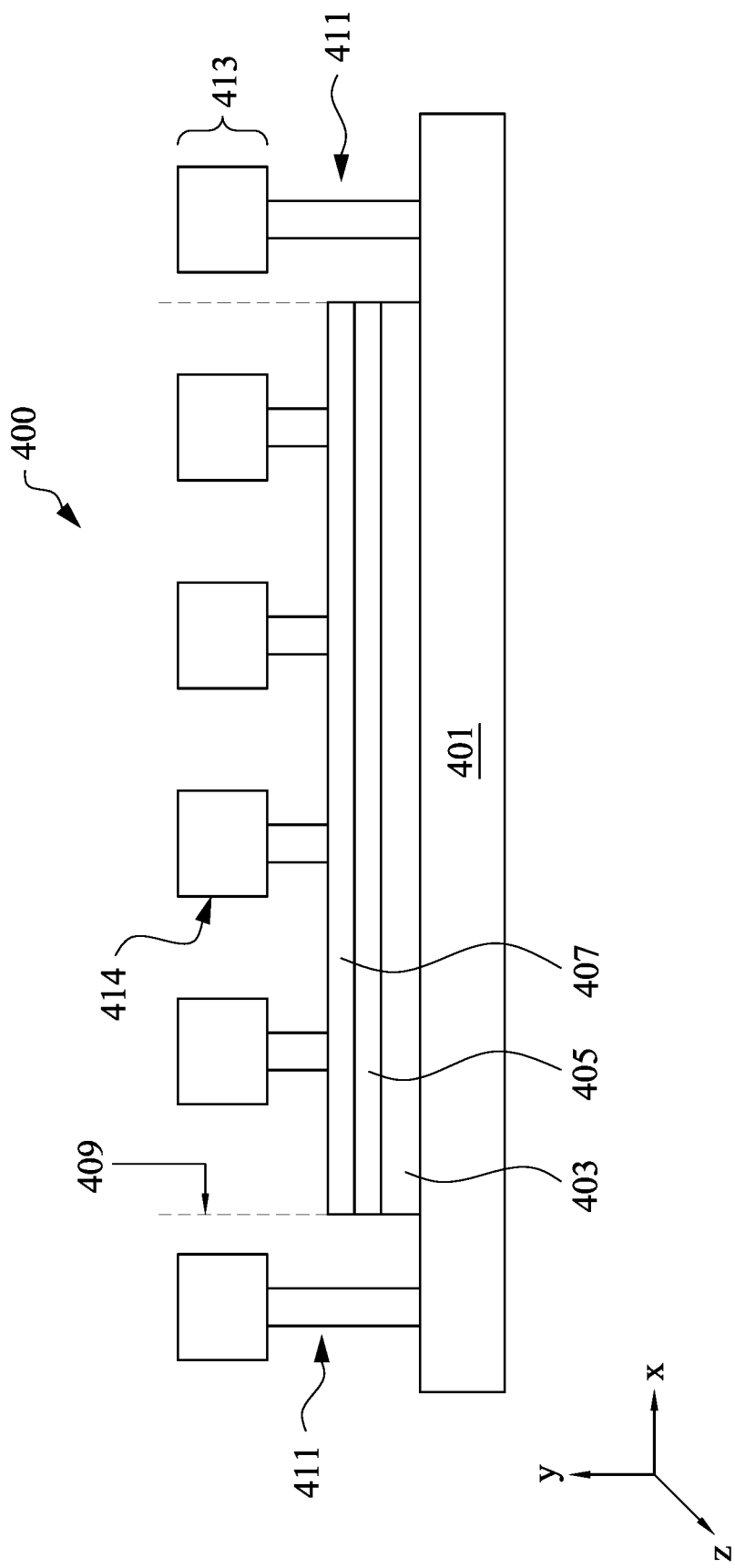
FIG. 4A depicts a cross-sectional of an example semiconductor device with additional vias formed directly on the metal interconnect layer in accordance with various embodiments of the present disclosure.

FIG. 4A depicts a cross-sectional of an example semiconductor device 400 with additional vias 411 formed directly on metal interconnect layer 401 in accordance with various embodiments of the present disclosure. Semiconductor device 400 operates for BEOL connections in which the non-overlapped deposits 402 (shown in FIG. 4B) of the first interconnect layer 401 are connected to devices directly through a via 411. Via 411 may be formed directly on the available space patterned by the mask layer 409 of metal interconnect layer 401. For example, metal interconnect layer deposit 402 may be directly connected to metal interconnect layer deposit 414 (shown in FIG. 4B) through a via 411. Concurrently, metal interconnect layer deposit 402 (shown in FIG. 4B) may be connected through resistive layer 403, the dielectric layer 405, and resistive layer 407 to metal interconnect layer deposit 414 through a via 411.

Figure 4B:
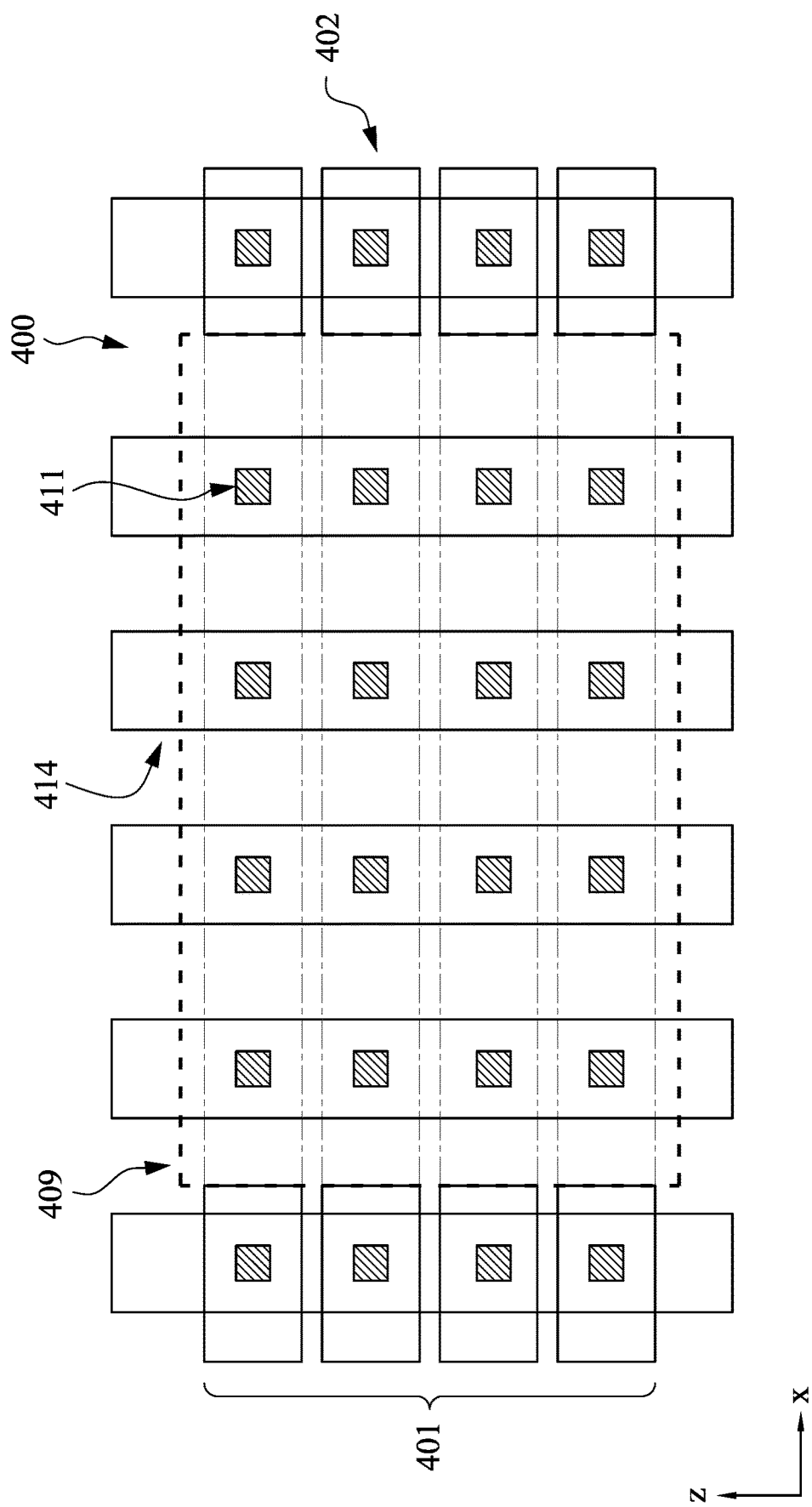
FIG. 4B depicts is a top-down view of semiconductor device of FIG. 4A illustrating metal interconnect deposits within the metal interconnect layer in accordance with various embodiments of the present disclosure.
Figure 4C:
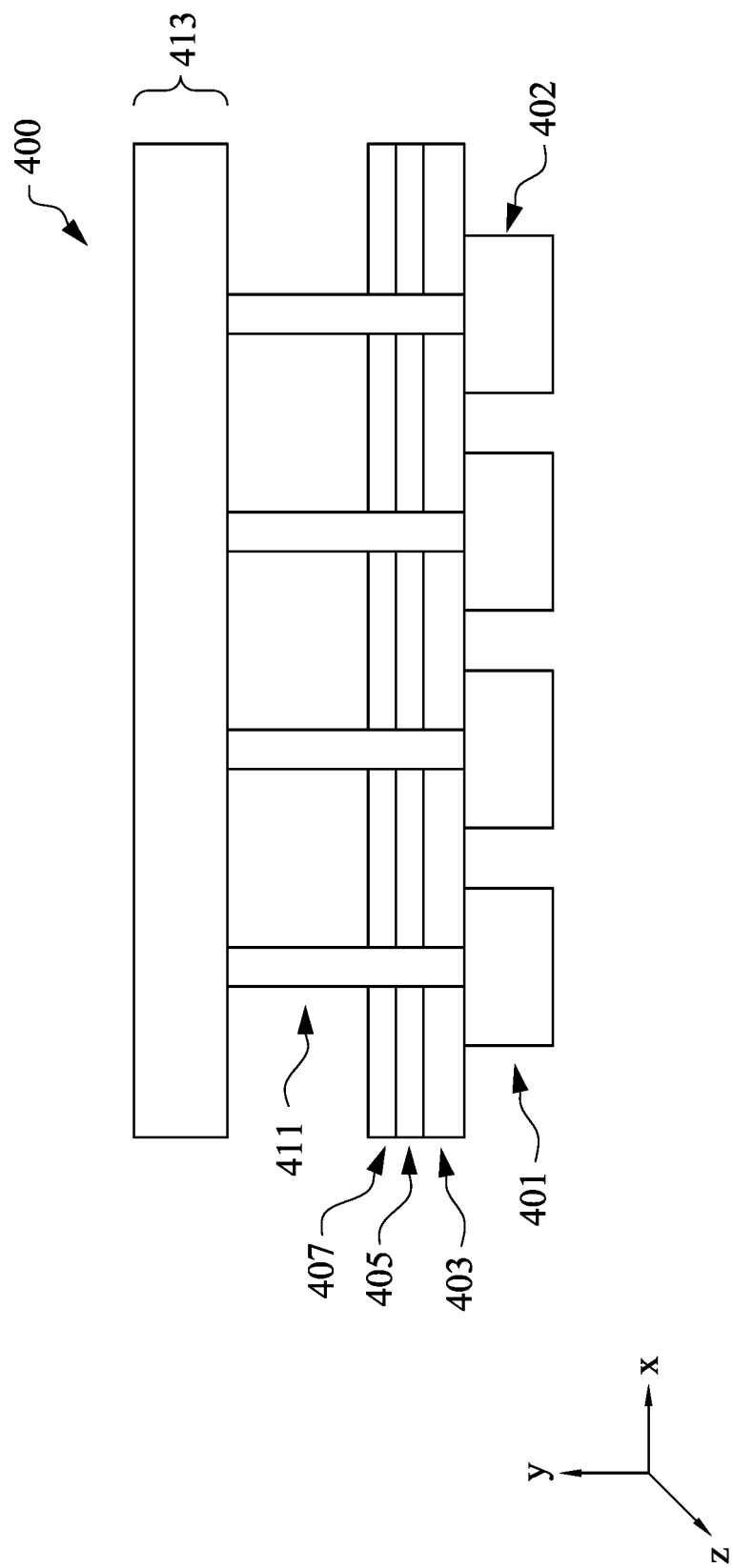
FIG. 4C depicts a side profile view of semiconductor device 400 of FIG. 4A in accordance with various embodiments of the present disclosure.

FIG. 4B depicts is a top-down view of semiconductor device 400 of FIG. 4A illustrating metal interconnect deposits 414 within metal interconnect layer 413 in accordance with various embodiments of the present disclosure. FIG. 4C depicts a side profile view of semiconductor device 400 of FIG. 4A in accordance with various embodiments of the present disclosure. Vias 411 are connected directly to the first interconnect layer 401. One or more additional vias may be formed behind the vias 411 on resistive layer 407 as depicted in FIG. 4A and FIG. 4B.

Figure 5:
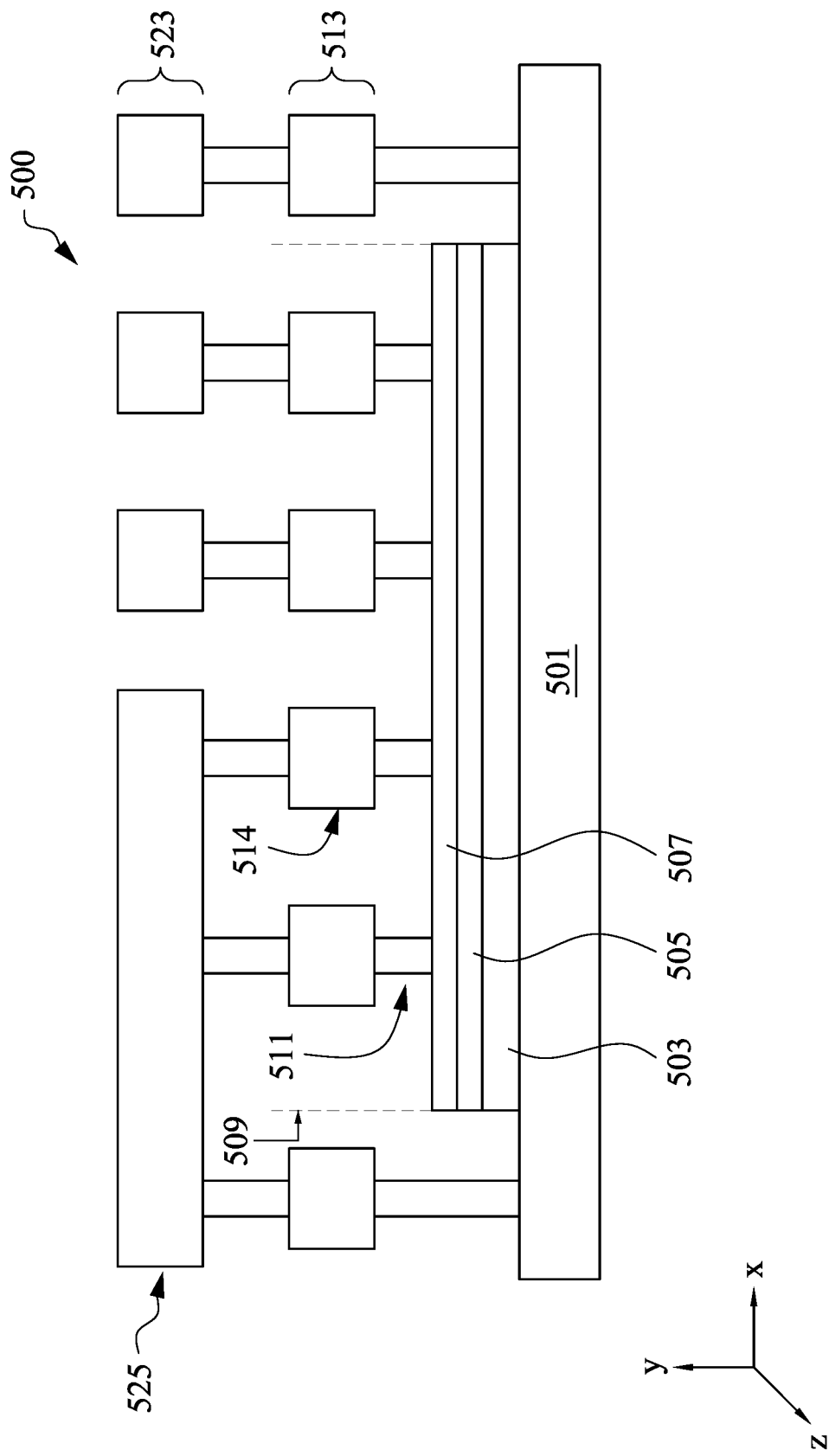
FIG. 5 depicts a cross-sectional view of another example semiconductor device in accordance with various embodiments of the present disclosure.

FIG. 5 depicts a cross-sectional view of another example semiconductor device 500 in accordance with various embodiments of the present disclosure. Semiconductor device 500 allows for connection between a number of connected of metal interconnect layers. For example, metal interconnect layer 501 is connected through a via 511 to metal interconnect layer 513 and again through a via 511 to metal interconnect layer 523. In some embodiments, the metal interconnect layer may be a single connected deposit. In alternative embodiments, the metal interconnect layer may be a number of connected and separated deposits (e.g., metal interconnect layer 523). BEOL designs may form direct connections between interconnect layers through vias 511. In alternative embodiments, MIM capacitors may be formed in the BEOL between interconnect layers. In some embodiments, a metal interconnect deposit 525 will not span the length of the metal interconnect layer 523. The metal interconnect deposits 514 may be formed above resistive layer 507 or above the interconnect layer 501. Resistive layer 503, dielectric layer 505, and resistive layer 507 are formed before the formation of metal interconnect layer 513 and metal interconnect layer 523. Resistive layer 503, dielectric layer 505, and resistive layer 507 are shaped by the mask layer 509 to allow for electrical connections around the resistive layers and the MIM capacitor.

Figure 6B:
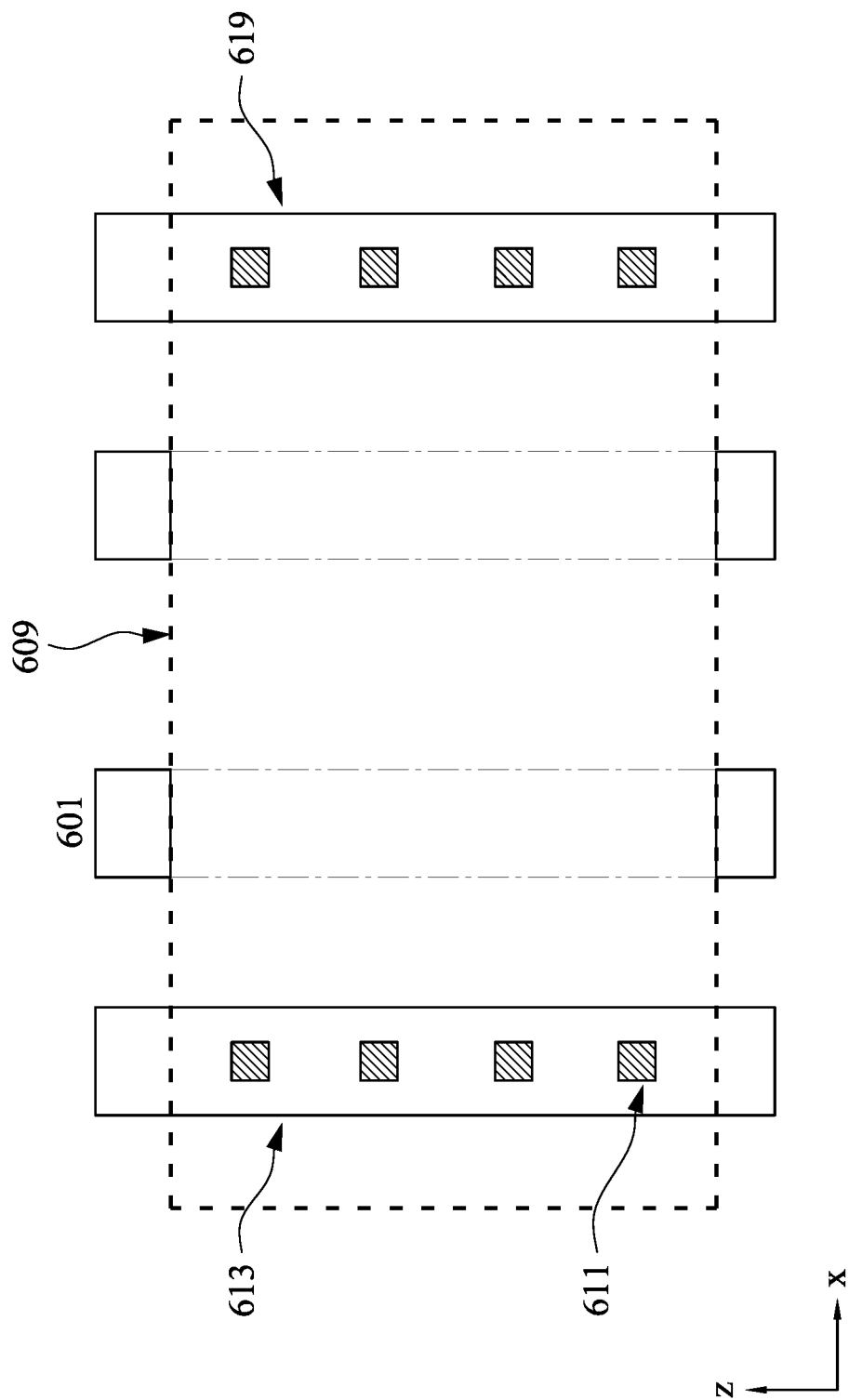
FIG. 6B depicts a top-down view of the semiconductor device of FIG. 6A in accordance with various embodiments of the present disclosure.

FIG. 6A-B depict views of another example semiconductor device 600 in which metal interconnect layers are deposited in parallel. FIG. 6A depicts a cross-sectional view of an example semiconductor device 600 in accordance with various embodiments of the present disclosure. FIG. 6B depicts a top-down view of the semiconductor device 600 of FIG. 6A in accordance with various embodiments of the present disclosure. Semiconductor device 600 forms resistive characteristics between metal interconnect layer 601 and metal interconnect layer 613 as current flows across either resistive layer 603 or resistive layer 607. Metal interconnect layer 601 and metal interconnect layer 613 remain separated by a MIM capacitor formed across the dielectric layer 605. Semiconductor device 600 operates similar to a capacitor and resistor in series as current flows across the MIM capacitor and one of the resistive layers (e.g., either resistive layer 603 or resistive layer 607). A metal interconnect deposit 619 in metal interconnect layer 613 is electrically connected to other metal interconnect deposits 619. Metal interconnect deposits 619 connect to metal interconnect layer 601 through the second interconnect layer 613 resulting in resistor characteristics. The majority of current flows through the resistive layer having the lowest resistivity level. In alternative embodiments, if the resistivity of resistive layer 603 and resistive layer 607 is approximately the same, current flows approximately evenly through both resistive layers.

Figure 7:
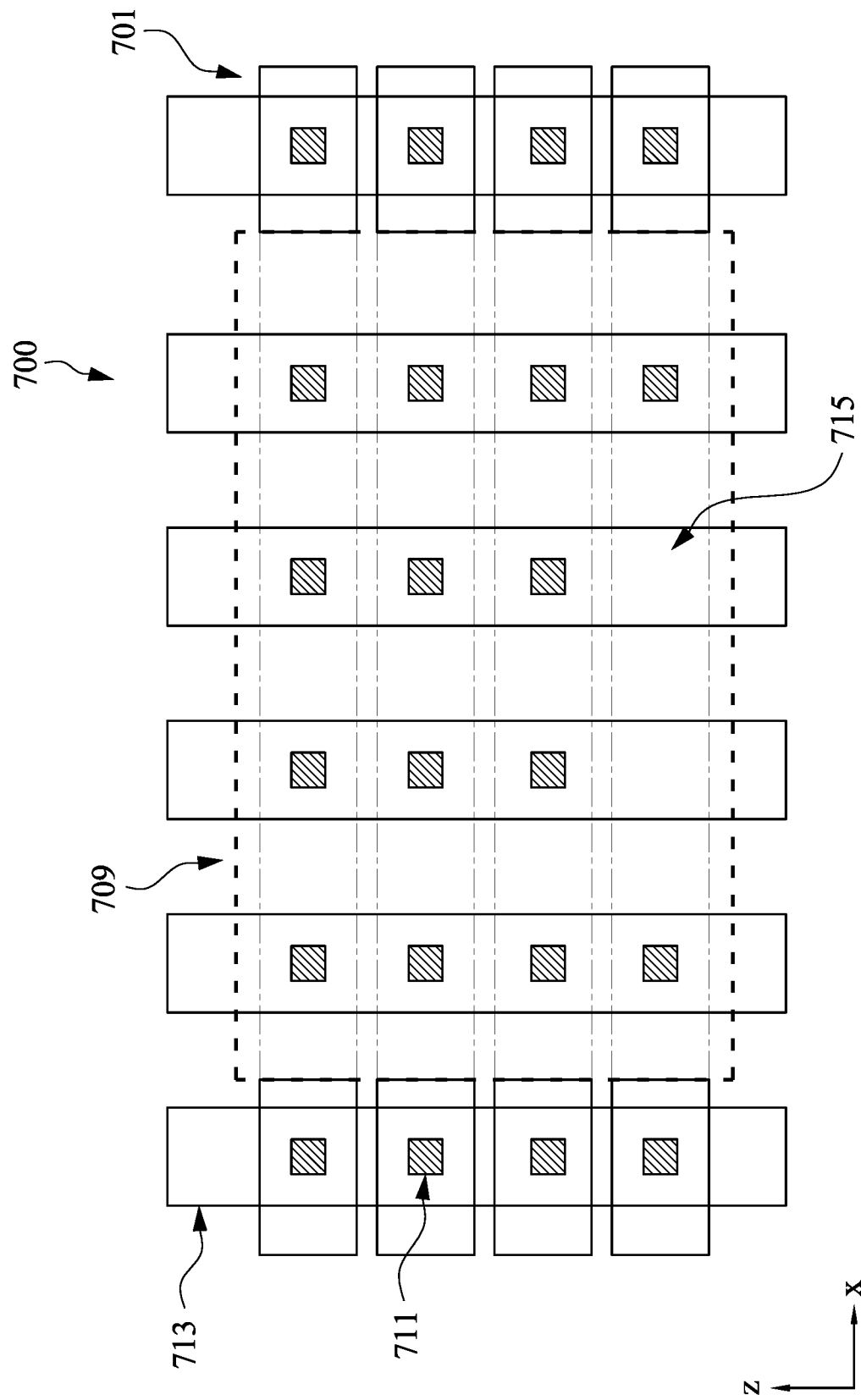
FIG. 7 depicts a top-down view of an example semiconductor device having selective via formation in accordance with various embodiments of the present disclosure.

FIG. 7 depicts a top-down view of an example semiconductor device 700 having selective via formation in accordance with various embodiments of the present disclosure. Semiconductor device 700 does not include uniform via formation. For example, vias 711 are not formed in area 715. As a result, no current flows between interconnects 701 and 713 at area 715 and the voltage may float. Semiconductor device 700 allows for connections across long portions of resistive layers for higher resistance. Additionally, semiconductor device 700 also allows metal interconnect layers to float between layers connected to active devices for reduction in parasitic capacitance. The mask layer 709 shapes the MIM capacitor to form space open for vias 711 to be formed directly between metal interconnect layer 713 and metal interconnect layer 701.

Figure 8:
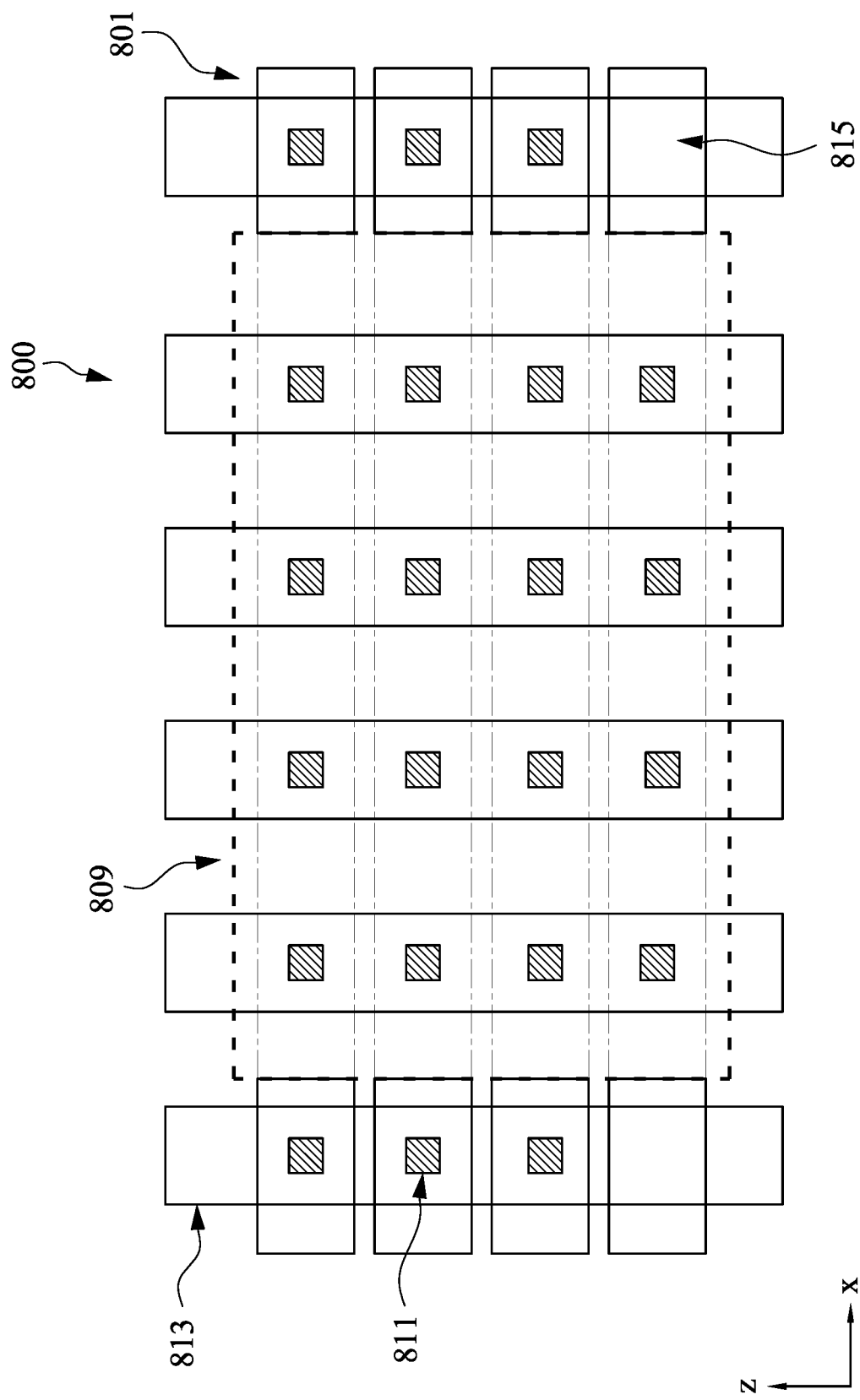
FIG. 8 depicts a top-down view of an example semiconductor device having selective via formation in accordance with various embodiments of the present disclosure.

FIG. 8 depicts a top-down view of an example semiconductor device 800 having selective via formation in accordance with various embodiments of the present disclosure. Semiconductor device 800 has areas such as area 815 in which vias are not formed between certain deposits in the first interconnect layer 801 and the second interconnect layer 813. For example, a via may not be formed in area 815 where the mask layer 809 has structured the dielectric layers and resistive layers so that metal interconnect layer 801 and metal interconnect layer 813 overlap but lack a connecting via.

Figure 9:
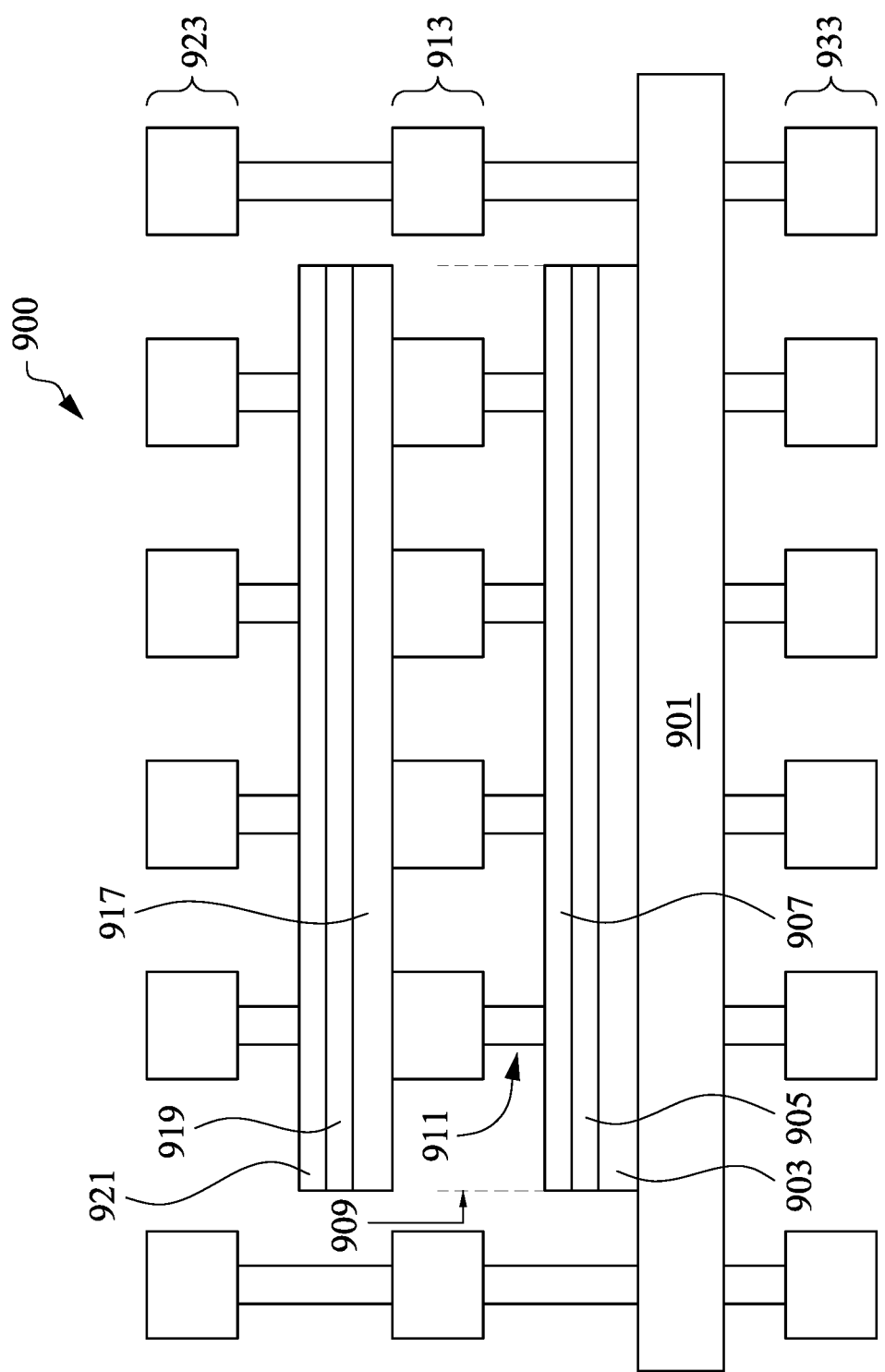
FIG. 9 depicts a cross-sectional view of another example semiconductor device in accordance with various embodiments of the present disclosure.

FIG. 9 depicts a cross-sectional view of another example semiconductor device 900 in accordance with various embodiments of the present disclosure. Semiconductor device 900 includes a number metal interconnect layers 901, 913, 923, 933 with additional MIM capacitors formed in series between (i) metal interconnect layer 913 and 923 and (ii) metal interconnect layer 901 and 913. Semiconductor device 900 also includes metal interconnect layers running along different axis parallel or perpendicular from other metal interconnect layers. For example, metal interconnect layer 913 runs parallel to metal interconnect layer 923, along the y-axis. Metal interconnect layer 913, however, runs perpendicular to metal interconnect layer 901, along the x-axis. Semiconductor device 900 has two MIM capacitors. One MIM capacitor is formed using resistive layer 903, dielectric layer 905, and resistive layer 907 on metal interconnect layer 901 and shaped using the mask layer 909. This MIM includes vias 911 connecting it to metal interconnect layer 913. The second MIM capacitor is formed on metal interconnect layer 913 between metal interconnect layer 913 and metal interconnect layer 923. This second MIM capacitor includes resistive layer 917, dielectric layer 919, and resistive layer 921. Semiconductor device 900 also includes a metal interconnect layer 933 below metal interconnect layer 901, forming a MIM capacitor between any two metal interconnect layers.

Figure 10:
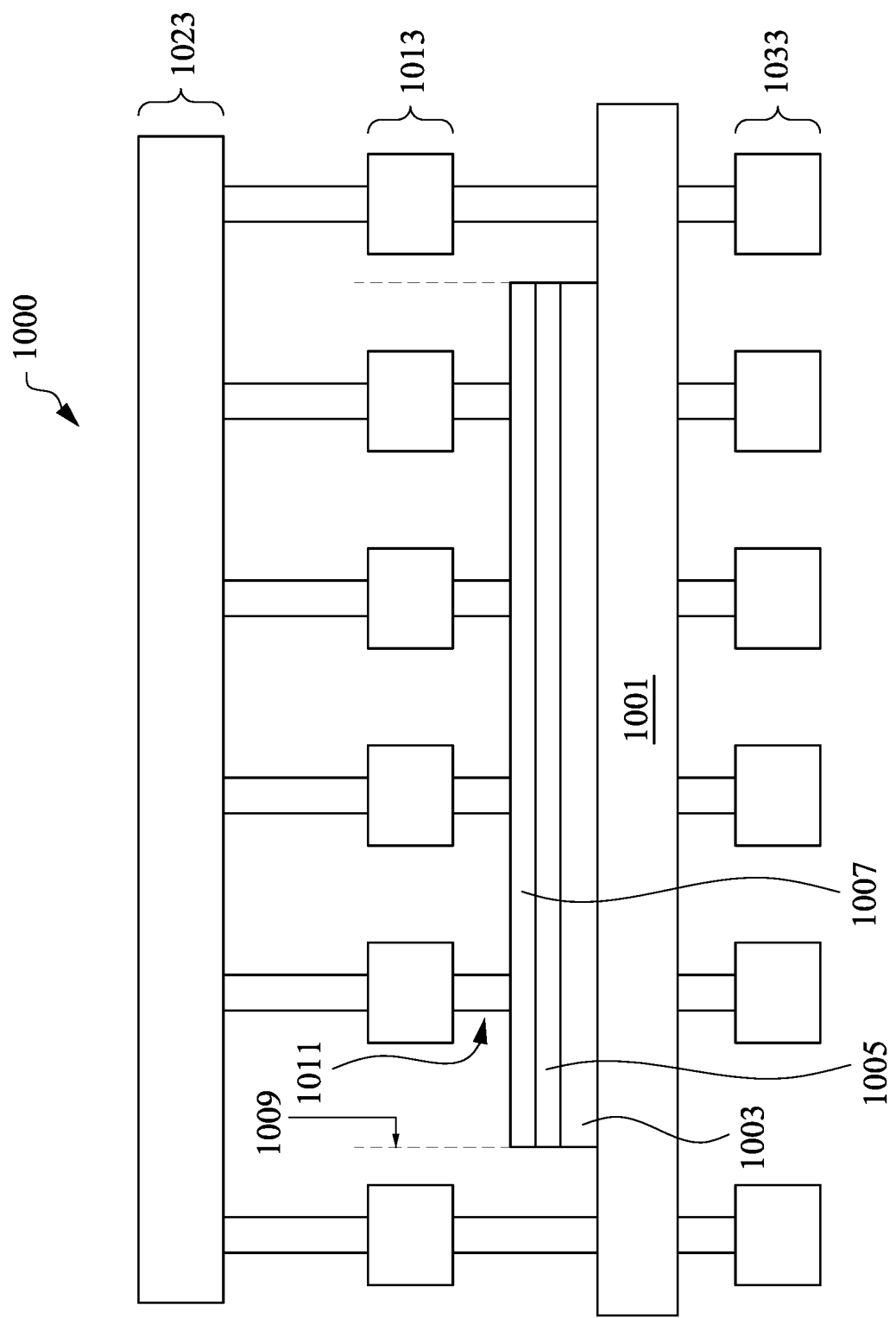
FIG. 10 depicts a cross-sectional view of another example semiconductor device in accordance with various embodiments of the present disclosure.

FIG. 10 depicts a cross-sectional view of another example semiconductor device 1000 in accordance with various embodiments of the present disclosure. Semiconductor device 1000 includes a metal interconnect layer 1023 and a metal interconnect layer 1033 below metal interconnect layer 1001. Semiconductor device 1000 includes a single MIM capacitor formed between the metal interconnect layer 1001 and metal interconnect layer 1013. Mask layer 1009 shapes the MIM capacitor. The MIM capacitor is formed by resistive layer 1003, dielectric layer 1005, and metal interconnect layer 1007. In some embodiments, the direction of the metal interconnect layer switches between adjacent layers for optimal scaling of the semiconductor device 1000.

FIG. 11 depicts an example flow chart 1100 depicting a process for manufacturing a semiconductor device in accordance with various embodiments of the present disclosure. While the process of FIG. 11 is applicable to many different structures, it is described with reference to structures of FIG. 1 for ease of understanding. A first metal interconnect layer 101 is formed, at 1101. A first resistive layer 103 is formed, at 1103, on top of the first metal interconnect layer 101. A first resistive layer 103 may be formed simultaneously with the dielectric layer 105 and the second resistive layer 107. The dielectric layer 105 is formed, at 1105, on top of the first resistive layer 103. The second resistive layer 107 is formed, at 1107, on top of the dielectric layer 105. Photolithography shapes the resistive layer 103, the dielectric layer 105, and the second resistive layer 107 using a mask 209 to pattern the layers. The patterning process allows for further electrical connections to be added to semiconductor device 100.

FIG. 12 depicts an example flow chart 1200 depicting a process for operating a semiconductor device in accordance with various embodiments of the present disclosure. A HDMIM capacitor formed within a first resistive layer, a dielectric layer, and a second resistive layer is charged, at 1201. The HDMIM capacitor is operated, at 1203. The first resistive layer, the dielectric layer, and the second resistive layer are formed simultaneously using a single mask layer.

Formation of the various semiconductor devices described herein can eliminate the use of additional masks by requiring only a single mask to shape the resistive layers and the dielectric layers. These semiconductor device form HDMIM capacitors without the use of an extra mask layer. Minimizing the number of mask layers can increase efficiency of producing semiconductor devices by freeing up resources and/or minimizing overall cost of production.

In one embodiment, a method for manufacturing a semiconductor device includes forming a first interconnect layer. A first resistive layer is formed on top of the first interconnect layer. A dielectric layer is formed on top of the first resistive layer. A second resistive layer is formed on top of the dielectric layer.

In another embodiment, a semiconductor device includes a first interconnect layer, a first resistive layer disposed on top of the interconnect layer, a dielectric layer disposed on top of the first resistive layer, and a second resistive layer disposed on top of the dielectric layer.

In yet another embodiment, a method includes charging a MIM capacitor formed within a first resistive layer, a dielectric layer, and a second resistive layer and operating the MIM capacitor. The first resistive layer, the dielectric layer, and the second resistive layer are formed simultaneously using a single mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

This written description and the following claims may include terms, such as "on," that are used for descriptive purposes only and are not to be construed as limiting. The embodiments of a device or article described herein can be manufactured, used, or shipped in a number of positions and orientations. For example, the term "on" as used herein (including in the claims) may not necessarily indicate that a first layer/structure "on" a second layer/structure is directly on and in immediate contact with the second layer/structure unless such is specifically stated; there may be one or more third layers/structures between the first layer/structure and the second layer/structure. The term "semiconductor device structure" used herein (including in the claims) may refer to shallow trench isolation features, poly-silicon gates, lightly doped drain regions, doped wells, contacts, vias, metal lines, or other types of circuit patterns or features to be formed on a semiconductor substrate.

What is claimed is:

1. A method for manufacturing a semiconductor device, comprising:
    forming a plurality of first interconnect layers each having a length extending in a first direction;
    forming a single piece of first resistive layer on tops of the first interconnect layers, wherein the first interconnect layers are arranged along the first resistive layer in a second direction transverse to the first direction;
    forming a dielectric layer on top of the first resistive layer;
    forming a second resistive layer on top of the dielectric layer;
    forming a plurality of second interconnect layers each having a length extending in the first direction and arranged along the second resistive layer in the second direction; and
    forming a plurality of vias interconnecting the second interconnect layers and the second resistive layer, each via having a length extending in a third direction transverse to the first and second directions, wherein the second resistive layer is configured to operate as a resistor.

2. The method of claim 1, wherein the first resistive layer, the dielectric layer, and the second resistive layer are formed using a mask.

3. The method of claim 1, wherein the first resistive layer, the second resistive layer, and the dielectric layer are formed simultaneously.

4. The method of claim 1, wherein the first interconnect layer comprises manganese.

5. The method of claim 1, wherein the first resistive layer comprises a metal, and the second resistive layer having a resistance higher than the first resistive layer.

6. The method claim 1, wherein the first resistive layer has a resistance greater than the second resistive layer, and the second resistive layer comprises a metal.

7. The method of claim 1, wherein the first resistive layer is in contact with the tops of the first interconnect layers.

8. The method of claim 1, wherein at least one of the second resistive layer and the dielectric layer have substantially the same length and width as the first resistive layer.

9. The method of claim 1, wherein at least one of the first interconnect layers are between the second interconnect layers.

10. A semiconductor device, comprising:
    a plurality of first interconnect layers each having a length extending in a first direction;
    a first resistive layer disposed on tops of the first interconnect layers, wherein the first interconnect layers are arranged along the first resistive layer in a second direction transverse to the first direction;
    a dielectric layer disposed on top of the first resistive layer;
    a second resistive layer disposed on top of the dielectric layer;
    a second interconnect layer having a length extending in the second direction;
    one or more first vias interconnecting the second interconnect layer and the second resistive layer, each first via having a length extending in a third direction transverse to the first and second directions;
    a third interconnect layer having a length extending in the second direction; and
    one or more second vias interconnecting the third interconnect layer and the first interconnect layers, each second via having a length extending in the third direction, wherein a number of the second vias is different from a number of the first vias.

11. The semiconductor device of claim 10, wherein the first interconnect layer comprises manganese.

12. The semiconductor device of claim 10, wherein the first resistive layer comprises a metal, and the second resistive layer having a resistance higher than the first resistive layer.

13. The semiconductor device of claim 10, wherein the first resistive layer has a resistance greater than the second resistive layer, and the second resistive layer comprises a metal.

14. The semiconductor device of claim 10, wherein the first resistive layer has a resistivity of approximately 100 to 300 ohms per cm squared.

15. The semiconductor device of claim 10, wherein the second resistive layer has a resistivity of greater than approximately 600 ohms per cm squared.

16. A method for manufacturing a semiconductor device, comprising:
    forming a plurality of first interconnect layers each having a length extending in a first direction;
    forming a single piece of first resistive layer on tops of the first interconnect layers, wherein the first interconnect layers are arranged along the first resistive layer in a second direction transverse to the first direction;
    forming a dielectric layer on top of the first resistive layer;

forming a second resistive layer on top of the dielectric layer, wherein the first resistive layer, the dielectric layer, and the second resistive layer are formed using a single mask;

forming a second interconnect layer having a length extending in the second direction;

forming one or more first vias interconnecting the second interconnect layer and the second resistive layer, each first via having a length extending in a third direction transverse to the first and second directions;

forming a third interconnect layer having a length extending in the second direction; and forming one or more second vias interconnecting the third interconnect layer and the first interconnect layers, each second via having a length extending in the third direction.

17. The semiconductor device of claim 10, further comprising:

a fourth interconnect layer;

one or more third vias interconnecting the fourth interconnect layer and the second resistive layer;

a fifth interconnect layer; and one or more fourth vias interconnecting the fifth interconnect layer and the first interconnect layers, wherein the first and second resistive layers and the dielectric layer are configured to operate as a plurality of capacitors.

18. The semiconductor device of claim 17, wherein a number of the third vias is equal to a number of the first vias.

19. The semiconductor device of claim 18, further comprising:

a sixth interconnect layer; and one or more fifth vias interconnecting the sixth interconnect layer and the second resistive layer, wherein a number of the fifth vias is equal to a number of the third vias.

20. The semiconductor device of claim 18, further comprising:

a sixth interconnect layer; and one or more fifth vias interconnecting the sixth interconnect layer and the second resistive layer, wherein a number of the fifth vias is less than to a number of the third vias.

* * * * *